United States Patent
Suwa et al.

(10) Patent No.: US 7,110,305 B2
(45) Date of Patent: Sep. 19, 2006

(54) NONVOLATILE SEMICONDUCTOR MEMORY DEVICE FOR OUTPUTTING A STATUS SIGNAL HAVING AN OUTPUT DATA WIDTH WIDER THAN AN INPUT DATA WIDTH

(75) Inventors: Hitoshi Suwa, Takatsuki (JP); Manabu Komiya, Kyoto (JP); Yasuhiro Tomita, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/099,605

(22) Filed: Apr. 6, 2005

(65) Prior Publication Data

US 2005/0237826 A1    Oct. 27, 2005

(30) Foreign Application Priority Data

Apr. 9, 2004    (JP) .............................. 2004-115884

(51) Int. Cl.
*G11C 7/10*    (2006.01)

(52) U.S. Cl. ........................... 365/189.02; 365/230.02; 365/230.06

(58) Field of Classification Search ........... 365/189.02, 365/230.02, 230.06
See application file for complete search history.

(56) References Cited

U.S. PATENT DOCUMENTS

| | | | |
|---|---|---|---|
| 5,734,919 A * | 3/1998 | Walsh et al. ........... | 365/185.13 |
| 6,052,303 A * | 4/2000 | Chevallier et al. ..... | 365/185.03 |
| 6,442,076 B1 | 8/2002 | Roohparvar | |
| 6,584,022 B1 * | 6/2003 | Tsuji .......................... | 365/200 |
| 6,841,983 B1 * | 1/2005 | Thomas ..................... | 323/322 |
| 2003/0084231 A1 | 5/2003 | Yoshimura | |
| 2005/0104133 A1 * | 5/2005 | Kanno et al. ................ | 365/154 |

OTHER PUBLICATIONS

JEDEC Standard No. 21-C, pp.3.5.3-2.

* cited by examiner

*Primary Examiner*—Tuan T. Nguyen
(74) *Attorney, Agent, or Firm*—McDermott Will & Emery LLP

(57) ABSTRACT

An n-bit status signal indicating an execution state of a write command is outputted from a status register. At the time of data writing, an output switching circuit outputs (n×m)-bit data in which a status signal pattern repeats m times. At the time of data reading, the output switching circuit outputs data stored in a memory cell array.

7 Claims, 7 Drawing Sheets

NONVOLATILE SEMICONDUCTOR MEMORY DEVICE FOR OUTPUTTING A STATUS SIGNAL HAVING AN OUTPUT DATA WIDTH WIDER THAN AN INPUT DATA WIDTH

BACKGROUND OF THE INVENTION

1. Field of the Invention

The present invention relates to a nonvolatile semiconductor memory device for outputting a status signal having an output data width wider than an input data width and indicating an execution state of a write command.

2. Description of the Background Art

FIG. 6 is a block diagram illustrating a structure of a conventional nonvolatile semiconductor memory device 101 (hereinafter referred to as a memory device 101) and its host system 102. The memory device 101 comprises: a memory cell array in which nonvolatile memory cells such as flash memory cells are disposed in the form of a matrix; and a control circuit therefor (both are not shown in the drawing). The control circuit comprises a circuit (e.g., a decoder, a sense amplifier, or a status register) for performing a write operation and a read operation based on a command outputted from the host system 102.

While writing is performed, a control signal (a chip enable signal NCE, an output enable signal NOE, and a write enable signal NWE), an address signal AIN, and a data signal DI are inputted to the memory device 101. These signals are outputted from the host system 102. Based on the inputted signals, the memory device 101 performs a series of processes including erasure, writing, and status signal output.

FIG. 7 is a timing chart showing a timing at which data is written into the conventional nonvolatile semiconductor memory device compliant with the JEDEC (Joint Electron Device Engineering Council) standard (more specifically, a timing at which a write command is executed and status check is performed). Note that the JEDEC standard-based nonvolatile semiconductor memory device is described in JEDEC Standard No 21-C, page 3.5.3-2. As shown in FIG. 7, according to the JEDEC standard, there are first to fourth cycles for each address command and data command used when data PD is written into an address PA. That is, four address commands (555, AAA, 555, and PA) and four data commands (AA, 55, A0, and PD) are sequentially inputted to the memory device 101. The first and second cycles (address commands 555 and AAA, and data commands AA and 55) correspond to a malfunction prevention cycle, which is referred to as an unlock cycle. Also, the third cycle (address commands 555 and data command A0) is a write setup cycle.

FIG. 7, DATA[7] and DATA[6] are 2-bit data contained in an 8-bit status signal indicating an execution state of a write command. DATA[7] and DATA[6] are read by the host system 102 via a cache memory 103, a multiplexer 104, and an 8-bit input-output data bus DB (more specifically, DB7 and DB6).

The memory device 101 has functions for data polling and toggle bit. These functions allow the host system 102 to read a status during writing or a status at the time of completion of writing. DATA[7] is a signal for data polling. As shown in FIG. 7, DATA [7] indicates the same value as that of data /DI7, which is inverted data of write data DI7, while writing is performed. When writing is completed, DATA [7] indicates the same value as that of write data DI7. On the other hand, DATA[6] is a signal which toggles with a chip enable signal NCE during writing and stops toggling when writing is completed. The host system 102 uses DATA[7] and DATA[6] outputted from the memory device 101 for performing status check.

Conventionally, the use of a memory device whose output data width is wider than an input data width requires address control for status check. For example, the memory device 101 as shown in FIG. 6 performs address control so that a status signal is outputted from lower 8 bits of 64-bit output, and the status signal thus outputted is inputted to the host system 102 via the 8-bit input-output data bus DB. Therefore, when writing is performed for an address whose lower 3 bits are other than zero, it is necessary to perform address control for changing the lower 3 bits of the address to 0 h. In order to perform such address control, it is necessary to design appropriate software to be installed in the host system, or additionally provide hardware such as an address decoding circuit.

However, the complexity of the conventional address control contributes to the increased number of processes for software development or bloated software. Also, due to the necessity of the above-described address control, the conventional memory device needs to be combined with a particular host system, whereby the usability of the device is impaired.

SUMMARY OF THE INVENTION

Therefore, an object of the present invention is to provide an easy-to-use nonvolatile semiconductor memory device which is capable of preventing the increase in the number of processes for developing software to be executed by a host system and preventing the software from bloating.

A nonvolatile semiconductor memory device according to the present invention is a nonvolatile semiconductor memory device for outputting a status signal indicating an execution state of a write command. The nonvolatile semiconductor memory device comprises: a memory cell array having a plurality of nonvolatile memory cells disposed thereon; and a control circuit for controlling access to the memory cell array. The control circuit includes: a status signal outputting section for outputting the status signal having a data width of n (n is a natural number); and an output switching section for switching output between a signal having a data width of (n×m), in which the same status signal pattern repeats m (m is a natural number) times, and data stored in the memory cell array.

The nonvolatile memory device according to the present invention may be structured so that a value of m is determined based on a signal inputted from an external source.

Also, the value of m may be determined based on a first control signal inputted via a wire to which a fixed voltage is applied.

The nonvolatile semiconductor memory device may be operable to change the value m, which is determined based on the first control signal, based on a second control signal outputted from an external apparatus.

Also, the nonvolatile semiconductor memory device may be operable to change the value of m, which is determined based on the second control signal, based on a third control signal outputted from a host system used in conjunction with the device.

A value of (n×m) may be a power of two.

When an output data width of the output switching section is n×k (k is a natural number equal to or greater than m), invalid n×(k−m) bit may be set to either one or zero.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
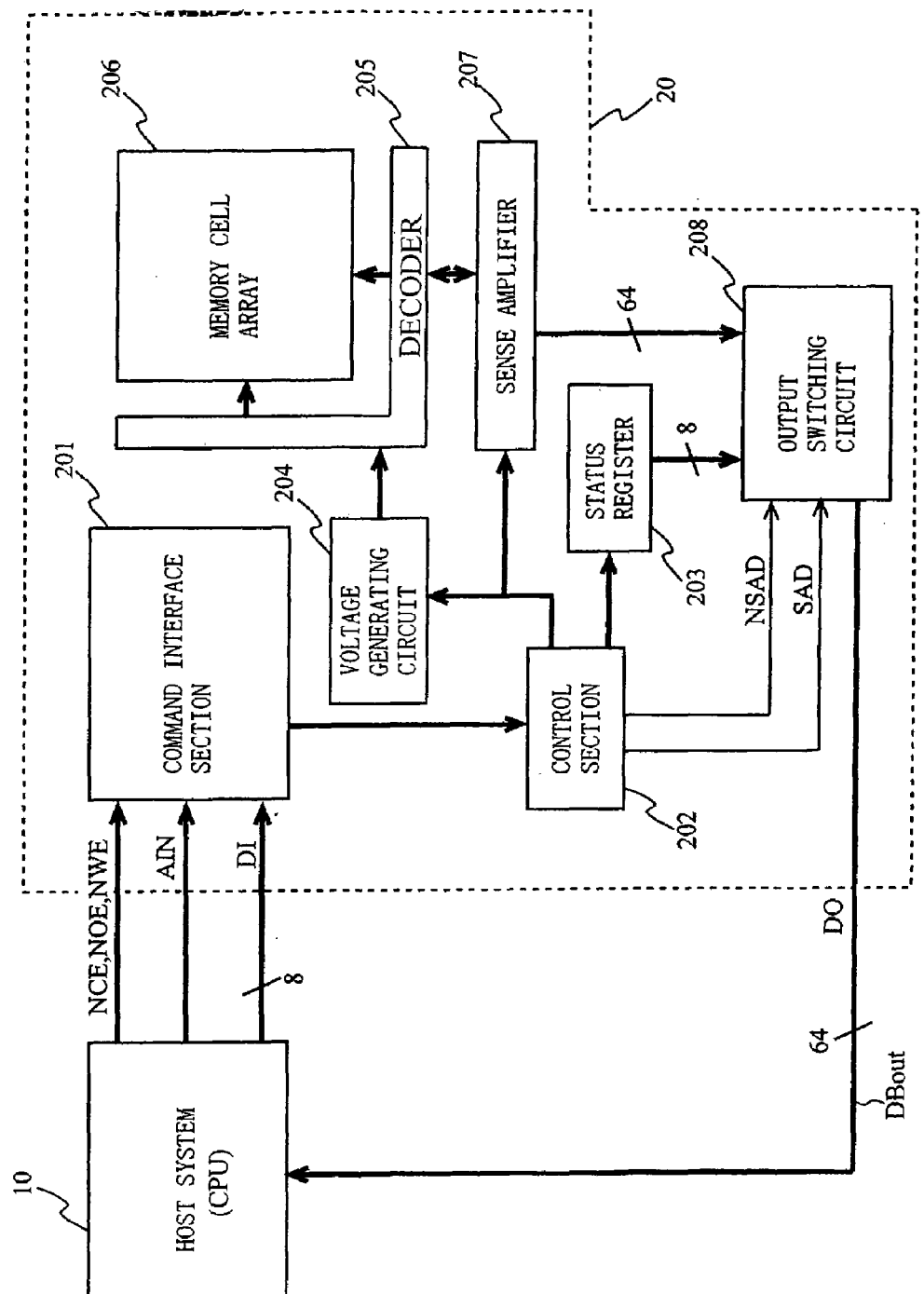
FIG. 1 is a block diagram illustrating a structure of a nonvolatile semiconductor memory device according to a first embodiment of the present invention and a host system.

FIG. 1 is a block diagram illustrating a nonvolatile semiconductor memory device 20 according to a first embodiment of the present invention (hereinafter referred to as a memory device 20) and a host system 10 such as a CPU. The memory device 20 comprises a memory cell array 206 and a control circuit therefor (a command interface section 201, a control section 202, a status register 203, a voltage generating circuit 204, a decoder 205, a sense amplifier 207, and an output switching circuit 208). The memory cell array 206 has nonvolatile memory cells such as flash memory cells arranged thereon in a matrix form. An input data width of the memory device 20 is 8 bit, whereas an output data width thereof is 64 bit, which is eight times of the input data width.

While writing is performed, a control signal (a chip enable signal NCE, an output enable signal NOE, and a write enable signal NWE), an address signal AIN, and a data signal DI are inputted to the memory device 20. These signals are outputted from the host system 10. Based on the signal received from the host system 10, the command interface section 201 generates a signal, and outputs the generated signal. Based on the signal outputted from the command interface section 201, a series of processes including memory erasure of memory cells, writing into memory cells, status signal output (status check) are performed.

More specifically, the control section 202 outputs the signal generated based on the signal received from the command interface section 201 to each of the voltage generating circuit 204, the sense amplifier 207, the status register 203, and the output switching circuit 208. Based on the inputted signal, the voltage generating circuit 204 sequentially applies an appropriate voltage to an appropriate wire of the decoder 205. The status register 203 stores a status signal indicating an execution state of a write command (i.e., a data polling signal and a toggle bit signal), and outputs the stored status signal.

The output switching circuit 208 selectively outputs a signal in which a plurality of status signals outputted from the status register 203 are arranged in a parallel manner and data read from the memory cell array. The decision as to whether to output data or signal depends on output switching signals NSAD and SAD to be outputted from the control section 202. An output signal DO outputted from the output switching circuit 208 is inputted to the host system 10 via an output data bus DBout.

Figure 2:
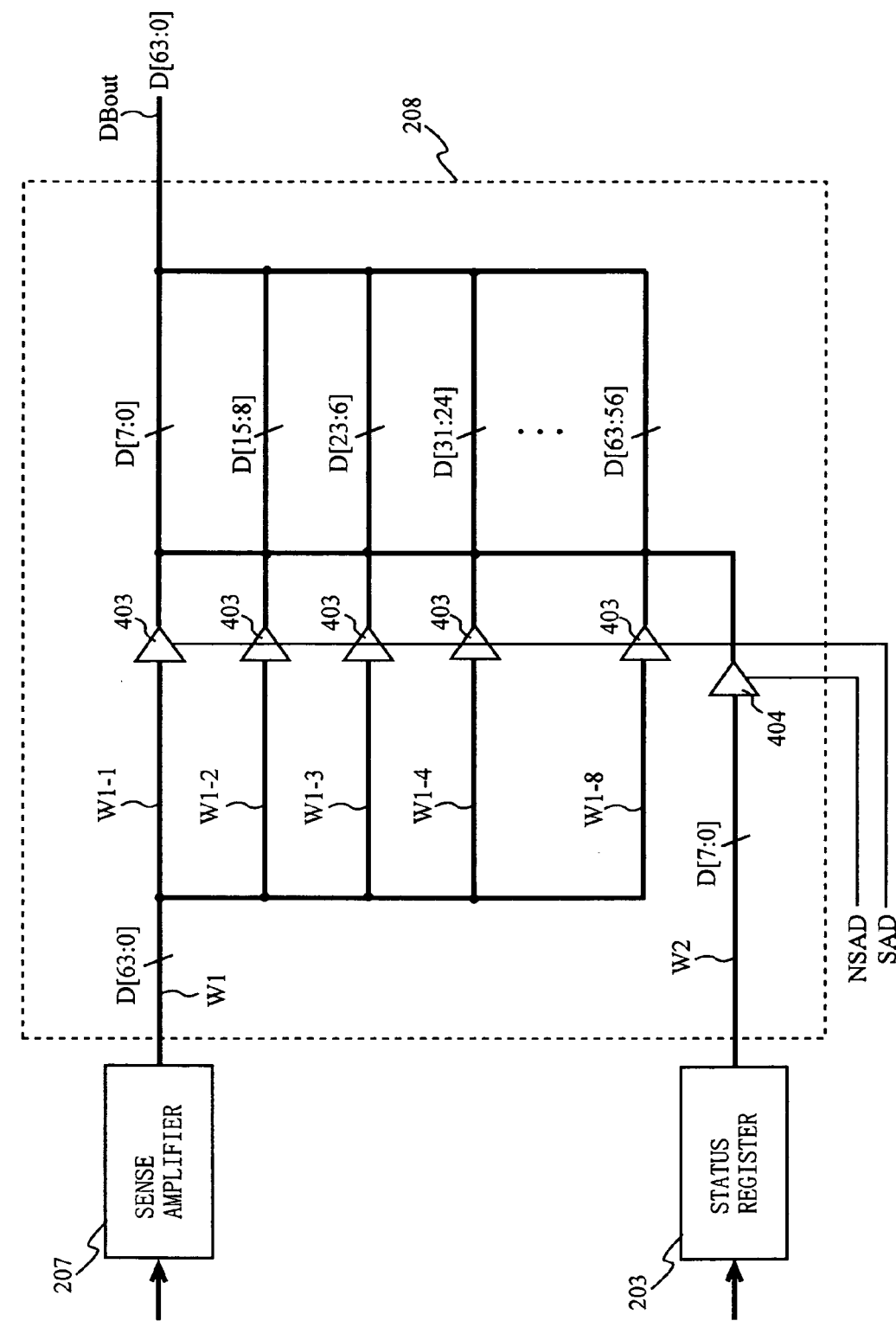
FIG. 2 is an illustration showing an exemplary structure of an output switching circuit as shown in FIG. 1.

FIG. 2 is an illustration showing an exemplary structure of the output switching circuit 208. The output switching circuit 208 comprises: tristate gate 403s which are controlled by a SAD signal, a 64-bit wire W1, an 8-bit wire W2; and a tristate gate 404 which is controlled by the NSAD signal. The 64-bit wire W1 consists of eight 8-bit wires W1-j (j is an integer between 1 and 8). Note that the tristate gates 403 and the tristate gate 404 each consist of eight commonly-used tristate gates.

At the time of data reading, the 64-bit data read from the memory cell array 206 via the sense amplifier 207 is read from the output switching circuit 208 into the host system 10. Specifically, at the time of data reading, the SAD signal and the NSAD signal are controlled so as to become "H" and "L", respectively. At this time, each tristate gate 403 directly outputs a value inputted via the 8-bit wires W1-j, whereas the tristate gate 404 does not output the status signal inputted via the second wire W2. As a result, data read from the memory cell array 206 is outputted from the output switching circuit 208.

On the other hand, at the time of data writing, the SAD signal and the NSAD signal are controlled so as to become "L" and "H", respectively. At this time, the tristate gate 404 directly outputs the status signal inputted via the second wire W2. As a result, the 64-bit signal outputted from the output switching circuit 208 via the 8-bit wire W2 and all the 8-bit wires W1-j is a signal in which the same status signal pattern repeats eight times.

Figure 3:
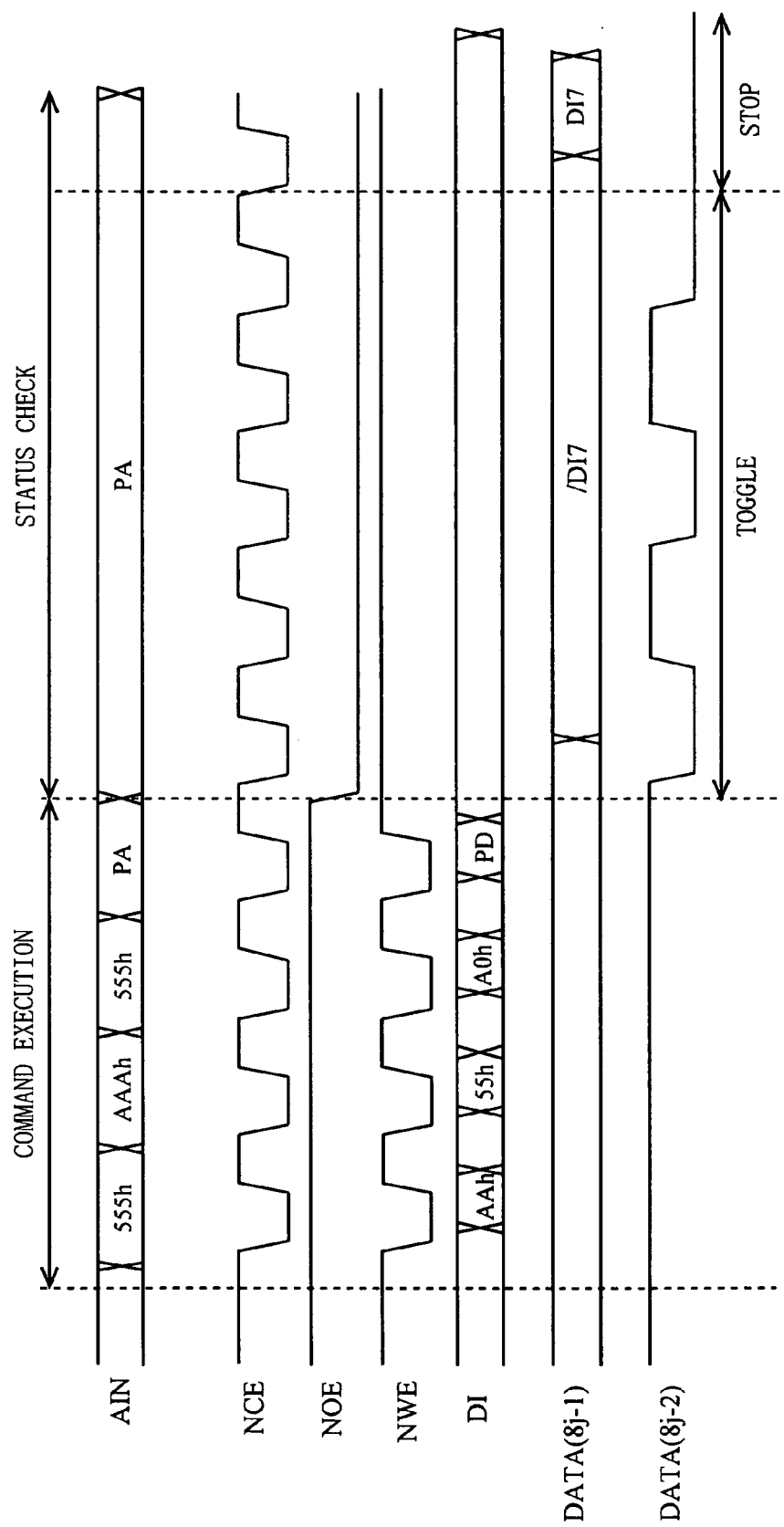
FIG. 3 is a timing chart showing a timing at which data is written into the nonvolatile semiconductor memory device of the present invention.

FIG. 3 is a timing chart showing a timing at which data is written into the JEDEC standard-based memory device 20. As shown in FIG. 3, according to the JEDEC standard, there are four command cycles for each address command and data command used when data PD is written into an address PA. That is, four address commands (555, AAA, 555, and PA) and four data commands (AA, 55, A0, and PD) are sequentially inputted to the memory device. The first and second cycles (address commands 555 and AAA, and data commands AA and 55) correspond to a malfunction prevention cycle, which is referred to as an unlock cycle. Also, the third cycle (address commands 555 and data command AO) is a write setup cycle.

Due to the 8-bit status signal containing a SR7 signal and a SR6 signal, the 64-bit signal outputted from the output switching circuit 208 contains eight SR7 signals and eight SR6 signals. While writing is performed, SR7, which is a signal generated for data polling, indicates the same value as that of data /DI7, which is inverted data of write data DI7. When writing is completed, SR7 indicates the same value as that of write data DI7. On the other hand, SR6 is a signal which toggles with a chip enable signal NCE during writing and stops toggling when writing is completed. In FIG. 3, j-th (j is an integer between 1 and 8) SR7 and SR6 sent over the 64-bit wire W1 are referred to as DATA[8j-1] and DATA[8j-2], respectively. Based on DATA[8j-1] or DATA[8j-2], the host system 10 performs status check.

Conventionally, when writing is performed for a memory device whose output data width is wider than an input data width, it is necessary to perform address control for reading a status signal from a predetermined location in the output data width. Therefore, in the case where an address indicated by a write command (write destination address) is different from a read address at the time of status check, address change is required when status check is performed.

On the other hand, the memory device 20 outputs a signal in which the same pattern of the status signal outputted from the status register 203 repeats according to the output data width, whereby the host system 10 can read the status signal without changing an address indicated by a write command. Thus, the host system 10 used in conjunction with the memory device 20 does not need to have software install for performing address control for status check purposes. As a result, it is possible to reduce software design time and processing load on the system.

For the sake of conciseness, the present embodiment have exemplified the nonvolatile semiconductor memory device with 8-bit input data width and 64-bit output data width, but it is not limited thereto. The present invention is effectively applied to a nonvolatile semiconductor memory device whose output data width is wider than an input data width.

Second Embodiment

Figure 4:
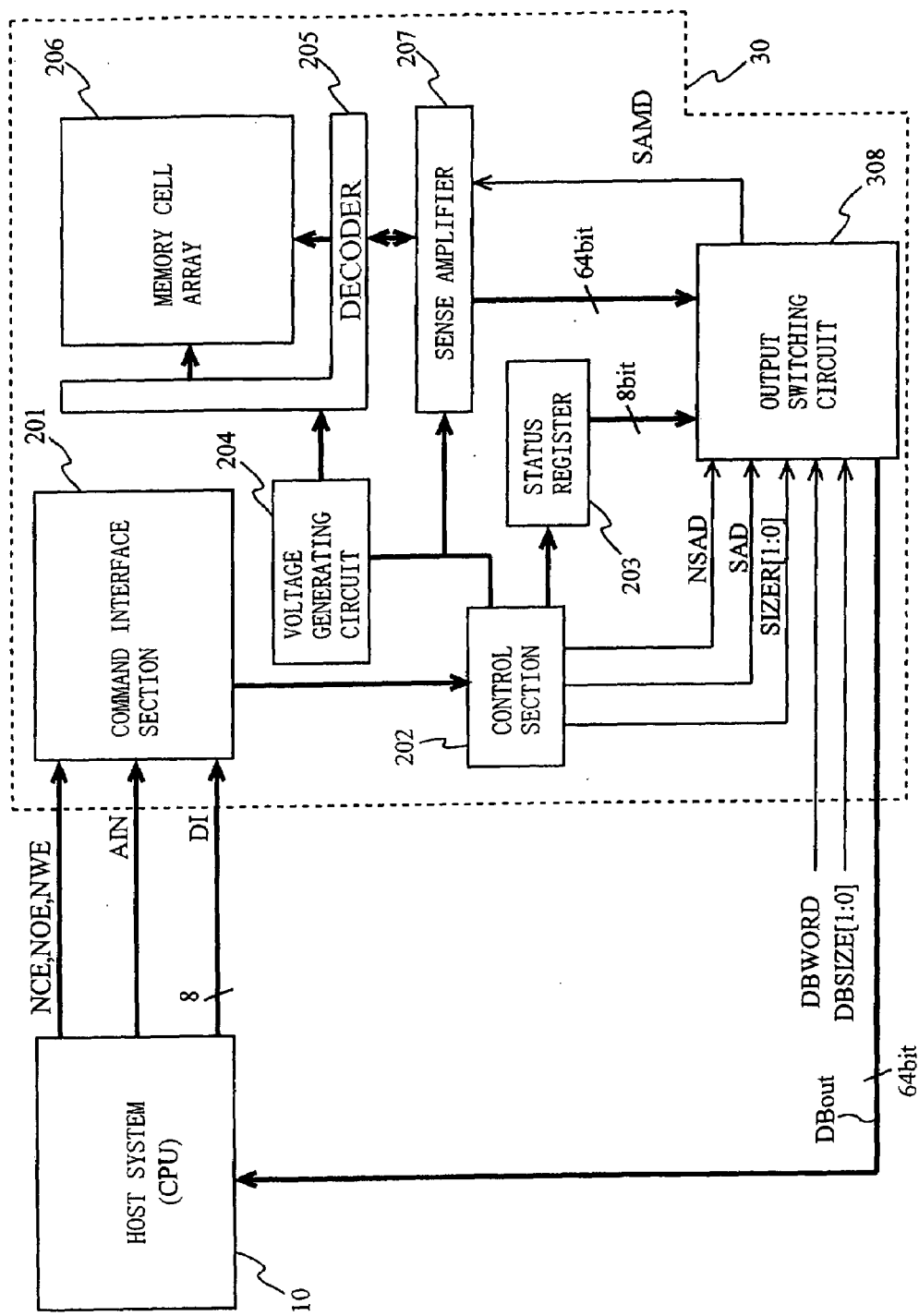
FIG. 4 is a block diagram illustrating a structure of a nonvolatile semiconductor memory device according to a second embodiment of the present invention and a host system.

FIG. 4 is a block diagram illustrating a nonvolatile semiconductor memory device 30 according to a second embodiment of the present invention (hereinafter referred to as a memory device 30) and its host system 10. In place of the output switching circuit 208 according to the first embodiment, the memory device 30 comprises an output switching circuit 308 for the host system 10 which performs reading with a bit width narrower than an output data width (in this case, 64-bit output data width). The output switching circuit 308 is obtained by adding new functions to the output switching circuit 208. In the present embodiment, any component elements of the memory device 30 that have similar counterparts in the first embodiment will be denoted by the same reference numerals as those used therein, and the description thereof is omitted.

Figure 5:
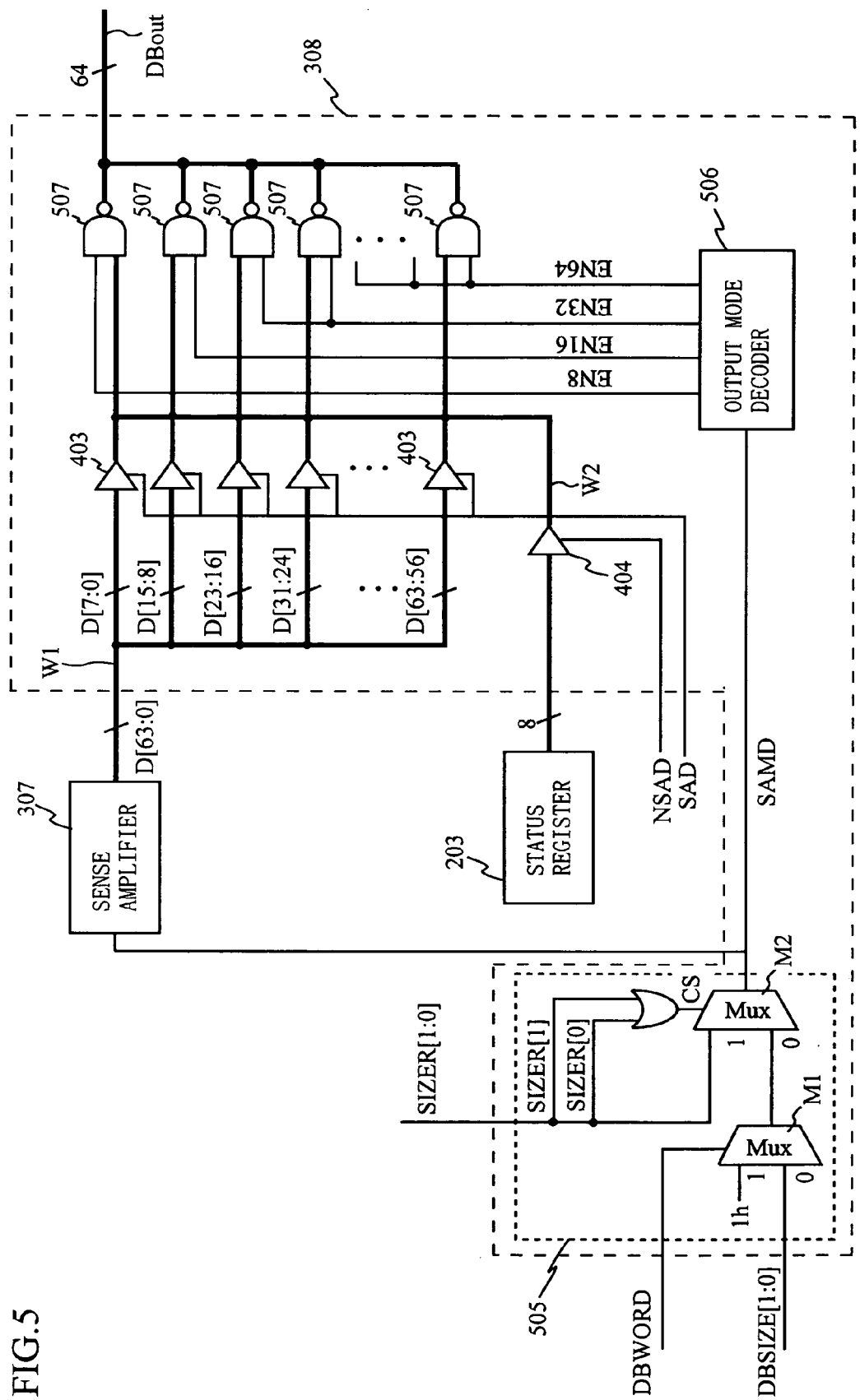
FIG. 5 is an illustration showing an exemplary structure of an output switching circuit as shown in FIG. 4.
Figure 6:
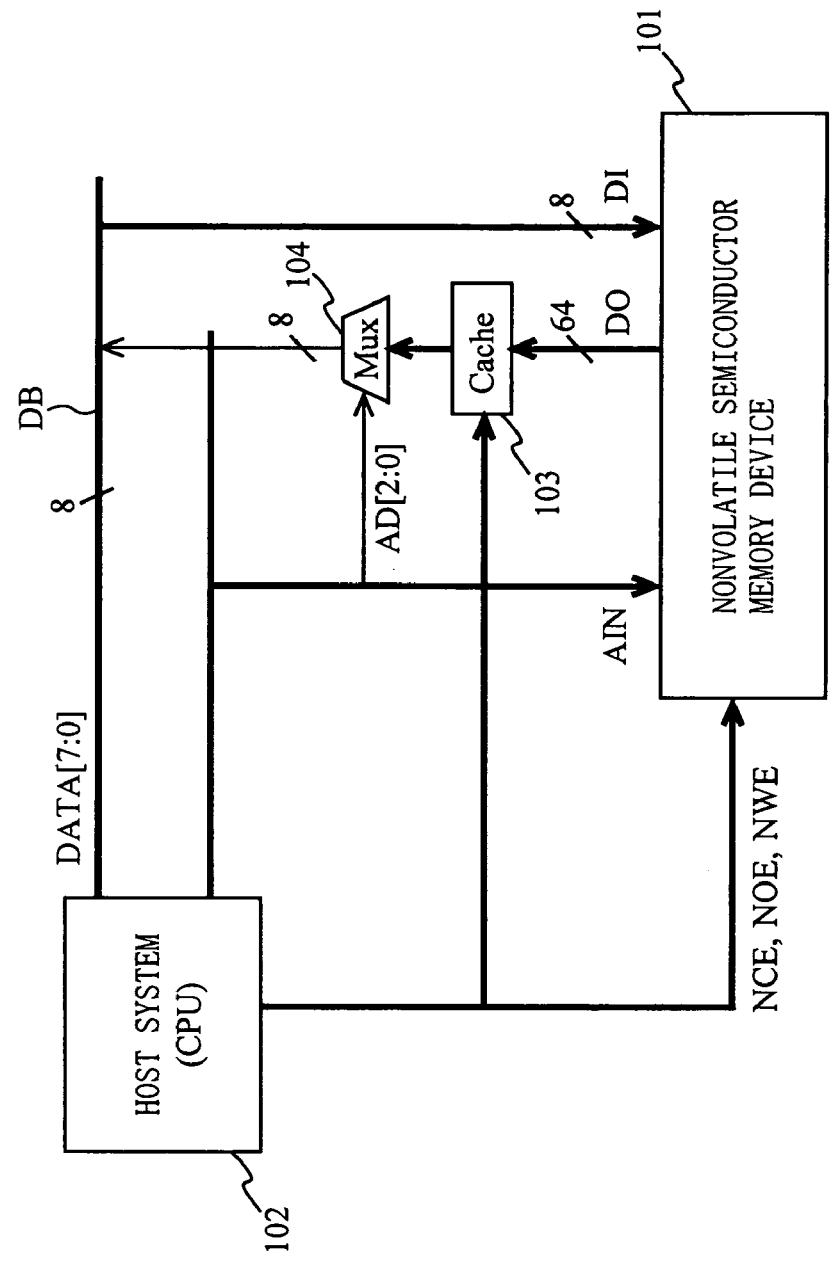
FIG. 6 is a block diagram illustrating a structure of a conventional nonvolatile semiconductor memory device and a host system.
Figure 7:
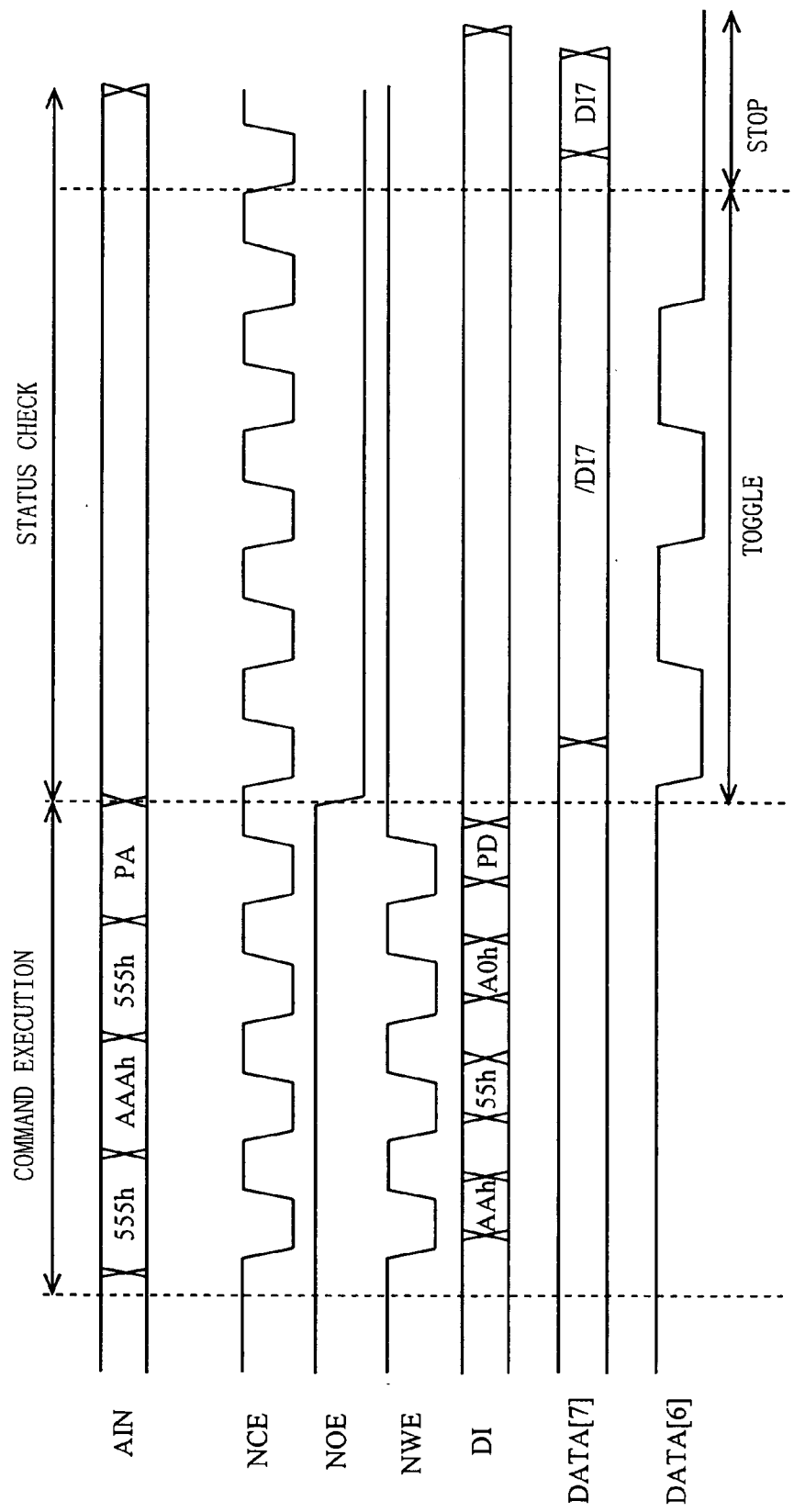
FIG. 7 is a timing chart showing a timing at which data is written into the conventional nonvolatile semiconductor memory device.

FIG. 5 is an illustration showing an exemplary specific structure of the output switching circuit 308. The output switching circuit 308 comprises the 64-bit wire W1, the 8-bit wire W2, the tristate gate 403, the tristate gate 404, a bus width determination section 505, an output mode decoder 506, and a NAND gate 507. Each NAND gate 507 consists of eight commonly-used NAND gates (not shown).

The bus width determination section 505 comprises first and second multiplexers M1 and M2. The first multiplexer M1 outputs either a fixed value (1 h) or a DBSIZE signal (hereinafter referred to as DBSIZE) in accordance with a DBWORD signal (hereinafter referred to as DBWORD) inputted from outside of the memory device 30. The second multiplexer M2 outputs either a value outputted from the multiplexer M1 or a SIZER signal (hereinafter referred to as SIZER) in accordance with a control signal CS. Note that, hereinafter, the signal outputted from the second multiplexer M2 is referred to as a sense amplifier mode signal (hereinafter referred to as SAMD). The control signal CS is an output of an OR gate to which SIZER[0] and SIZER[1] are inputted. DBSIZE, DBWORD, and SIZER are externally inputted signals, and specific examples thereof will be described below. SAMD is inputted to the sense amplifier 307 and the output mode decoder 506. The output mode decoder 506 turns an EN8 signal, an EN16 signal, an EN32 signal, and an EN64 signal to "H" or "L" in accordance with a value indicated by SAMD.

At the time of data reading, among the 64-bit data read from the memory cell array 206, data D[8m-1:0] (m=8,4,2, 1) which directly passed through the first wire (i.e., whose value was not changed at the tristate gate 403 and the NAND gate 507) is read by the host system 10. At the time of data writing, data D[8m-1:0] (m=8,4,2,1) in which the same pattern of the status signal outputted from the status register 203 repeats m times is read by the host system 10.

More specifically, in the case where the host system 10 for reading 64-bit data is used, a signal for changing a value of SAMD to 3 h is inputted. In the case where a value of SAMD is 3 h, the output mode decoder 506 turns the signals EN8, EN16, EN32, and EN64 to "H". In this case, at the time of data writing (SAMD=3 h, SAD="L", and NSAD="H"), 64-bit data D[63:0], in which the same status signal pattern repeats eight times, outputted from the output switching circuit 308 is read by the host system 10. Also, at the time of data reading (SAMD=3 h, SAD="H", and NSAD="L"), 64-bit data D[63:0] read from the memory cell array 206 is read by the host system 10.

In the case where the host system 10 for reading 32-bit data is used, a signal for changing a value of SAMD to 2 h is inputted to the bus width determination section 505. In the case where a value of SAMD is 2 h, the output mode decoder 506 turns the signals EN8, EN16, and EN32 to "H", and turns the signal EN64 to "L". In this case, at the time of data writing (SAMD=2 h, SAD="L", and NSAD="H"), 32-bit data D[31:0], in which the same status signal pattern repeats four times, outputted from the output switching circuit 308 is read by the host system 10. Also, at the time of data reading (SAMD=2 h, SAD="H", and NSAD="L"), lower 32-bit data DB[31:0] of the 64-bit data read from the memory cell array 206 is read by the host system 10.

In the case where the host system 10 for reading 16-bit data is used, a signal for changing a value of SAMD to 1 h is inputted to the bus width determination section 505. In the case where a value of SAMD is 1 h, the output mode decoder 506 turns the signals EN8 and EN16 to "H", and turns the signals EN32 and EN64 to "L". In this case, at the time of data writing (SAMD=1 h, SAD="L", and NSAD="H"), 16-bit data D[15:0], in which the same status signal pattern repeats two times, outputted from the output switching circuit 308 is read by the host system 10. Also, at the time of data reading (SAMD=1 h, SAD="H", and NSAD="L"), lower 16-bit data D[15:0] of the 64-bit data read from the memory cell array 206 is read by the host system 10.

In the case where the host system 10 for reading 8-bit data is used, a signal for changing a value of SAMD to 0 h is inputted to the bus width determination section 505. In the case where a value of SAMD is 0 h, the output mode decoder 506 turns the signal EN8 to "H", and turns the signals EN16, EN32, and EN64 to "L". In this case, at the time of data writing (SAMD=0 h, SAD="L", and NSAD="H"), an 8-bit status signal D[7:0] outputted from the output switching circuit 308 is read by the host system 10. Also, at the time of data reading (SAMD=0 h, SAD="H", and NSAD="L"), lower 8-bit data D[7:0] of the 64-bit data read from the memory cell array 206 is read by the host system 10.

Note that the bus width determination section 505 as shown in FIG. 5 is structured so as to set a bus width (more specifically, a value of m) as follows: a bus width is set based on DBWORD in the case where two types of signals, DBSIZE and DBWORD, are inputted; whereas a bus width is set based on SIZER in the case where three types of signals, DBSIZE, DBWORD, and SIZER, are inputted. DBSIZE may be a signal inputted via a wire formed on a substrate, on which the memory device 30 is mounted, and supplied with a fixed voltage. An output data width of the memory device 30 is not set during a manufacturing stage of the memory device 30; the output data width of the memory device 30 is set only when the memory device 30 is mounted on the substrate, whereby it is possible to provide an easy-to-use and versatile memory device.

DBWORD may be a signal outputted from an external apparatus connected to the memory device 30, for example. If a bus width determined based on a DESIZE signal is changeable by an externally inputted signal, it is possible for a memory device to re-set a bus width for test writing or writing by a writer. Thus, a further easy-to-use memory device can be provided.

If SIZER is a signal obtained from an internal register of the host system 10, for example, it is possible to change an output data width according to a reading data width of the host system 10. Thus, a further easy-to-use and versatile memory device 30 can be provided. Also, such a memory device 30 has the advantage of being able to facilitate failure analysis and debugging.

In the present embodiment, the case in which a signal whose value is selectively determined (DBWORD and SIZER) is preferentially used over a signal having a set value (DBSIZE) in order to set a bus width has been described. Setting a bus width in such a manner is useful in setting an output data width according to the circumstances under which a device is used, but it is not limited thereto. Also, the type and number of signals used for setting a bus width are not limited to those described in the present embodiment.

The memory device 30 fixes a voltage of an unused wire on the output data bus DBout to a particular value "H" by turning a predetermined signal among the signals EN16, EN32, and EN64 to "L". In other words, a physical output data width of the memory device 20 is n×k (=64) bit; when a signal in which the same pattern of n (=8)-bit status signal repeats m (=1,2,4,8) times is outputted, invalid n×(k−m) bit is set to a particular value. By fixing an output value other than a valid value in such a manner as described above, it is possible to reduce power consumption and prevent the host system from malfunctioning.

The nonvolatile semiconductor memory device 30 according to the present embodiment does not need address control for status check. Thus, the use of the nonvolatile semiconductor memory device according to the present invention simplifies software installed in the host system for address control, whereby it is possible to reduce software design time and processing load on the system.

Furthermore, the nonvolatile semiconductor memory device 30 according to the present embodiment can change an output data width according to the circumstances where a device is used. Thus, the nonvolatile semiconductor memory device 30 according to the present embodiment is easy-to-use and versatile.

While the invention has been described in detail, the foregoing description is in all aspects illustrative and not restrictive. It is understood that numerous other modifications and variations can be devised without departing from the scope of the invention.

What is claimed is:

1. A nonvolatile semiconductor memory device for outputting a status signal which has an output data width wider than an input data width and indicates an execution state of a write command, comprising:
   a memory cell array having a plurality of nonvolatile memory cells disposed thereon; and
   a control circuit for controlling access to the memory cell array,
   wherein the control circuit includes:
      a status signal outputting section for outputting the status signal having a data width of n (n is a natural number); and
      an output switching section for switching output between a signal having a data width of (n×m), in which a same status signal pattern repeats m (m is a natural number) times, and data stored in the memory cell array.

2. The nonvolatile semiconductor memory device according to claim 1,
   wherein a value of m is determined based on a signal inputted from an external source.

3. The nonvolatile semiconductor memory device according to claim 1,
   wherein a value of m is determined based on a first control signal inputted via a wire to which a fixed voltage is applied.

4. The nonvolatile semiconductor memory device according to claim 3,
   wherein the nonvolatile semiconductor memory device is operable to change the value m, which is determined based on the first control signal, based on a second control signal outputted from an external apparatus.

5. The nonvolatile semiconductor memory device according to claim 4,
   wherein the nonvolatile semiconductor memory device is operable to change the value of m, which is determined based on the second control signal, based on a third control signal outputted from a host system used in conjunction with the device.

6. The nonvolatile semiconductor memory device according to claim 1,
   wherein a value of (n×m) is a power of two.

7. The nonvolatile semiconductor memory device according to claim 1,
   wherein an output data width of the output switching section is n×k (k is a natural number equal to or greater than m), and n×(k−m) bit is set to either one or zero.

* * * * *